United States Patent [19]

Wheatcraft et al.

[11] Patent Number: 5,347,711
[45] Date of Patent: Sep. 20, 1994

[54] TERMINATION OF MULTI-CONDUCTOR ELECTRICAL CABLES

[75] Inventors: Paul A. Wheatcraft, Tualatin; Laurence A. Daane, Sherwood; Hans A. Blom, Portland, all of Oreg.

[73] Assignee: The Whitaker Corporation, Wilmington, Del.

[21] Appl. No.: 914,858

[22] Filed: Jul. 15, 1992

[51] Int. Cl.⁵ .................. H01R 43/02; H01R 9/16; B23K 20/12
[52] U.S. Cl. .................. 29/843; 29/828; 29/884; 156/73.5
[58] Field of Search ............ 29/566.3, 749, 750, 29/760, 828, 834, 842, 843, 884; 156/73.5, 303.1, 306.6; 174/74 R, 75 C, 88 R, 88 C, 88 S; 228/110, 111, 112, 180.1, 180.2

[56] References Cited

U.S. PATENT DOCUMENTS

| | | | |
|---|---|---|---|
| 3,069,753 | 12/1962 | Lalmond et al. | 29/843 |
| 3,891,013 | 6/1975 | Folk et al. | 140/147 |
| 4,052,778 | 10/1977 | Siden et al. | 29/749 |
| 4,060,887 | 12/1977 | De Groef | 29/626 |
| 4,085,502 | 4/1978 | Ostman et al. | 29/843 |
| 4,178,678 | 12/1979 | Carrillo et al. | 29/843 |
| 4,476,628 | 10/1984 | Kees, Jr. | 29/861 |
| 4,668,581 | 5/1987 | Luc et al. | 156/73.5 X |
| 4,697,339 | 10/1987 | Verhoeven | 29/828 |
| 4,763,410 | 8/1988 | Schwartzman | 29/828 |
| 4,815,207 | 3/1989 | Schwartzman | 29/828 |
| 4,852,249 | 8/1989 | Muskulus et al. | 29/825 |
| 5,010,642 | 4/1991 | Takahashi et al. | 29/868 |
| 5,016,347 | 5/1991 | Okazaki et al. | 29/825 |
| 5,125,150 | 6/1992 | Meyer | 29/566.3 |

FOREIGN PATENT DOCUMENTS

| | | | |
|---|---|---|---|
| 53-5789 | 1/1978 | Japan | 29/843 |
| 60-202966 | 10/1985 | Japan | 29/843 |
| 348490 | 3/1991 | Japan | 29/843 |

OTHER PUBLICATIONS

Brown "Bonded Gold Fingers . . . For General PWB Use" Proceeding of the 28th Electronic Components Conference, Anaheim Calif., USA, Apr. 1978, pp. 121–128.

Primary Examiner—Peter Dungba Vo
Attorney, Agent, or Firm—McClung & Stenzel Chernoff, Vilhauer

[57] ABSTRACT

A carrier, or transfer frame, includes a pair of support portions located on opposite sides of an opening defined by the frame to receive portions of individual conductors of a cable, with the conductors extending across the opening and held in desired positions relative to each other during transportation prior to installation in an electrical circuit. Each conductor is connected electrically to a respective test contact pad of electrically conductive material located on one of the support portions. The transfer frame is placed and held in a desired position adjacent a circuit while the conductors are soldered, with access to the individual conductors, including shield conductors, being gained through the opening defined by the transfer frame.

11 Claims, 3 Drawing Sheets

TERMINATION OF MULTI-CONDUCTOR ELECTRICAL CABLES

BACKGROUND OF THE INVENTION

The present invention relates to preparation of terminal portions of multi-conductor electrical cables and connection of the conductors of the terminal portions of such cables electrically to respective portions of electrical circuits, and in particular the present invention relates to terminal portions of cables including a large number of coaxial conductor pairs.

Multiple conductors often need to be installed and connected electrically with a portion of an electrical circuit at a predetermined spacing and to be terminated at a predetermined length for each conductor. The conductors may be single insulated conductors, or coaxial conductors, hereinafter referred to as coaxial conductor pairs, typically including a central conductor and a surrounding shield conductor. In some cases there may be additional coaxially located conductors, and the term coaxial pair is intended herein to include such conductors as well. Since terminal preparation work on individual conductors may be done at a location remote from the place where conductors are finally connected into an electronic circuit, the task of installing a large number of conductors individually in the proper places can be very time-consuming. Manually identifying and positioning conductors, shields, and non-conductive elements such as dielectric layers and jackets one by one during final installation of conductors thus makes the task of installing multi-conductor cables very tedious.

It is necessary to protect terminal portions of conductors from damage during transportation from the point of preparation to the location where final installation is to be carried out, and it is usually necessary to maintain proper identification of individual conductors, as when one end of a set of conductors, such as those included in a multi-conductor cable, is already connected to a multi-conductor connection device which fixed the identification of each conductor. The opposite terminal portions of such conductors have to be identified, prepared and connected into an electrical circuit in locations which depend on the arrangement of terminals in that electrical circuit, but which may involve entirely different groupings of the several conductors.

Furthermore, it is often necessary to test individual conductors or coaxial conductor pairs of a multi-conductor cable to be sure that they all meet specifications for various characteristics such as impedance, capacitance, signal transmission velocity, or cross-talk. It is undesirably time-consuming and often difficult or tedious to accomplish connection of test devices to conductors individually, particularly when the conductors are of extremely small size, when those conductors are not restrained against freedom of movement.

Additionally, it is sometimes desirable to achieve connection of the conductors or coaxial conductor pairs of multi-conductor cables with a portion of an electrical circuit in a space smaller than that which would be required if each of the conductors were attached through the use of a terminal connector attached to the cable and mating with a corresponding connector attached to the electrical circuit.

It has previously been suggested that improved speed of termination of groups of conductors from a multi-conductor cable can be accomplished using a device such as a supporting frame of thin metal to which each of the conductors may be mechanically attached, as by solder, to leave the conductors exposed within an opening defined by the frame so that they can be soldered appropriately into electrical connection with terminal pads and ground plane contacts located in a predetermined array, as on a printed circuit board or the like. The frame would include registration devices to keep it in the required position while the conductors are being connected. Such a frame, however, since it is conductive, would make it impossible to test capacitance, impedance, and other characteristics of the several conductors individually, and the thermal conductivity of such a metal frame would make it difficult to unsolder and replace individual conductors on such a frame if that should be necessary.

What is desired, then, is apparatus and a method through whose use it is possible to reduce the amount of time and manual labor needed to achieve electrical connection of many separate conductors or coaxial conductor pairs into an electrical circuit in specific positions, at a location remote from the manufacture and assembly of the conductors.

It is also desired to have apparatus and a method for its use in accomplishing separate testing and selective replacement of multiple conductors, such as those of a cable, more quickly than has previously been possible.

And finally, what is also desired is that the many conductors as prepared and held in a desired layout be preserved in this position temporarily so as to make removal from production fixtures and transportation to a remote site for termination possible.

SUMMARY OF THE INVENTION

The present invention responds to the aforementioned needs and shortcomings of the prior art by providing an electrically non-conductive carrier, or transfer frame, including several conductor attachment positions defined in a predetermined arrangement on a surface of the transfer frame. The invention also provides for receiving and mechanically holding another portion of each conductor which may be attached to the conductor attachment positions, in a position located on an opposite side of an opening defined in the transfer frame, so that a portion of each conductor spans the opening. The transfer frame according to the present invention includes a base plate of electrically non-conductive material defining a pair of support portions spaced apart from one another and separated from each other by the aforementioned opening. Registration guides are provided on the transfer frame to mate with a corresponding registration device provided on a portion of an electrical circuit where the conductors are to be terminated. In one embodiment of the invention registration pins are provided on a printed circuit board and registration holes are located correspondingly in the transfer frame.

In a preferred embodiment of the transfer frame, attachment positions are arranged on the first support portion to receive an end of each conductor, and an adhesive is provided on the second support portion to hold a further rearward portion of each conductor where the outer jacket is present, hereinafter to be referred to as a body portion of the conductor, so that the conductor can be supported extending across the opening. The attachment positions are arranged on the first support portion according to the requirement for the ultimate location of each of the several conductors for attachment to a portion of an electrical circuit.

In one embodiment of the invention each attachment position is defined by electrically conductive material to which a conductor can be connected electrically so that it functions as an electrical test contact and can be used to perform tests of the electrical characteristics of the conductors after they have been attached to the transfer frame.

One embodiment of the transfer frame includes a base plate made of material similar to that used for printed circuit boards, with the conductor attachment positions and corresponding test contacts being defined by electrically conductive material attached to the base plate by conventional printed circuit board techniques.

The transfer frame is used according to the method of the invention to prepare several conductors for being connected to an electrical circuit, by attaching several conductors, as from a multi-conductor cable, to respective attachment positions on the first, or front, support portion so that the conductors extend across the opening defined in the base plate. Further rearward, or body, portions of the conductors are attached to the second support portion of the transfer frame, so that all of the several conductors are arranged on the transfer frame in a spacing and orientation corresponding to that of terminals where they are to be attached to a portion of an electrical circuit. The several conductors can then be transported from a location where the terminal portions of the individual conductors have been prepared for connection, perhaps to be accomplished at a remote site, to a further part of an electrical circuit.

The transfer frame is utilized further according to the present invention in attaching the several conductors to an electrical circuit and connecting them electrically to appropriate terminals in an electrical circuit by placing the transfer frame and the attached conductors so that a front side of the transfer frame, to which the conductors are attached, is placed against the portion of an electrical circuit where the connections are to be made. The individual conductors are then connected electrically, as by soldering to terminals of the electrical circuit, with access to the conductors being gained through the opening in the transfer frame base plate. The transfer frame may then be removed, as by cutting the individual conductors, between the points of connection to the electronic circuit and the attachments to the attachment positions of the first support portion of the transfer frame, and by separating the adhesive material from the body portions of the individual conductors.

In accordance with a preferred manner of carrying out the method of the invention, the individual conductors are identified and arranged in a required order, and the terminal portion of each conductor is prepared for attachment to the transfer frame. The several conductors are attached to the transfer frame without changing the established arrangement, as by attaching a more rearward, or body, portion of each conductor to the second support portion of the transfer frame base plate and by also attaching each of the conductors to the appropriately located and defined attachment position on the first or front support portion of the transfer frame, preferably by soldering each conductor to an electrically conductive test pad provided at the attachment point.

Additionally, in accordance with the present invention it is preferred to test each of the conductors after attachment to the transfer frame, when the conductors are held conveniently in position on the transfer frame to permit test probe access to each conductor. Access is easily available to each of the shield conductors of a group of coaxial conductor pairs attached to the transfer frame, and the test contact pads provide convenient electrical contact with each of the central conductors of a group of coaxial conductor pairs, making it easier, especially in the case of extremely small central conductor size, to conduct required performance testing of the individual conductors once they have been attached to the transfer frame than when they are separate and unattached.

It is therefore a principal object of the present invention to provide an improved method for preparing several conductors for later connection in predetermined locations at predetermined spacings to a portion of an electrical circuit, and to provide apparatus for use in carrying out such a method.

It is another important object of the present invention to provide such apparatus and a method for its use which facilitates connecting several conductors to a portion of an electrical circuit in a shorter time than has previously been required to identify, arrange, and connect the same number of connectors separately to such an electrical circuit.

The foregoing and other objectives, features, and advantages of the invention will be more readily understood upon consideration of the following detailed description of the invention, taken in conjunction with the accompanying drawings.

DETAILED DESCRIPTION OF THE PREFERRED EMBODIMENT

Figure 1:
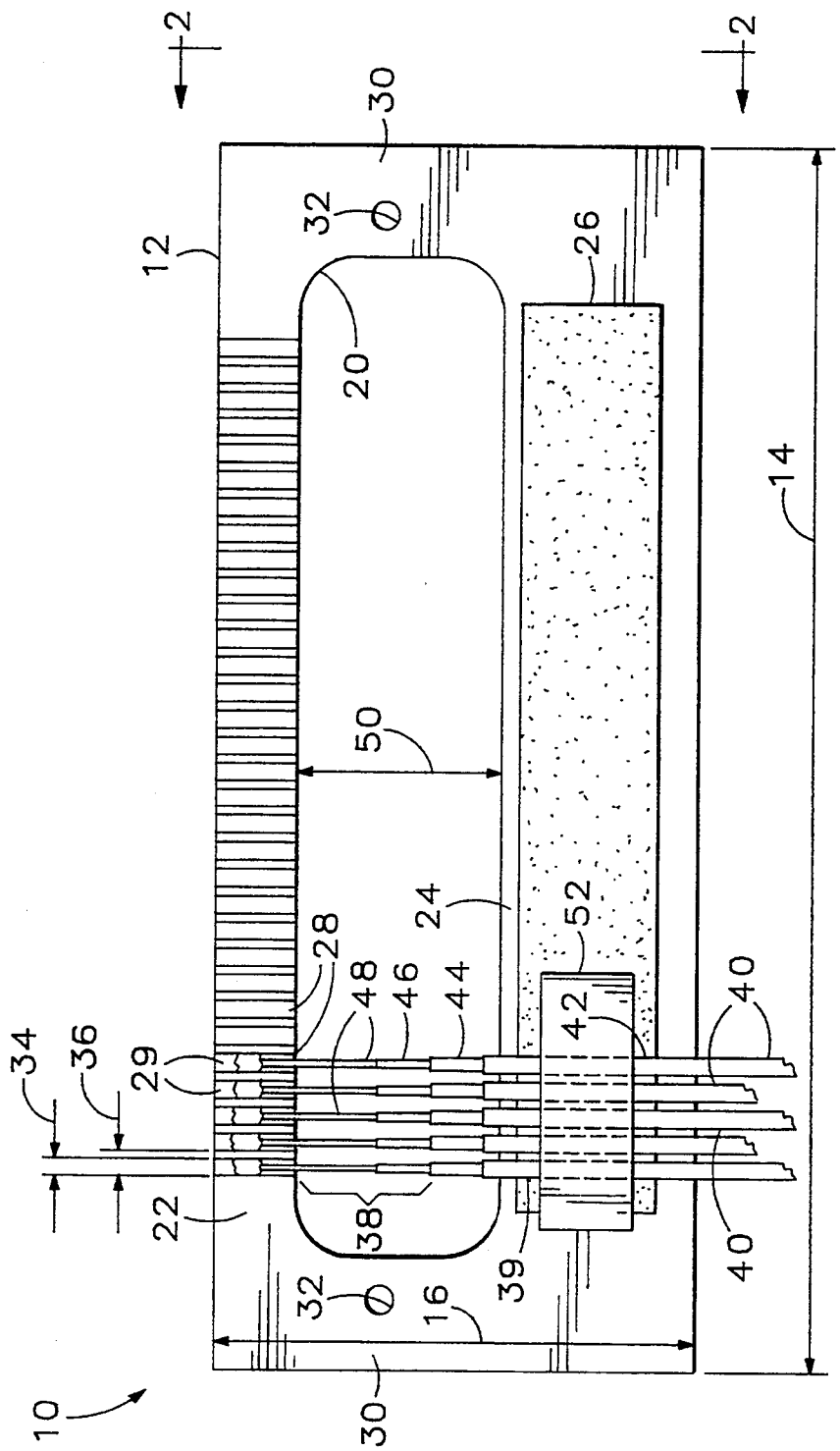
FIG. 1 is a plan view of a transfer frame according to the present invention, showing several coaxial conductor pairs attached to the transfer frame.
Figure 2:
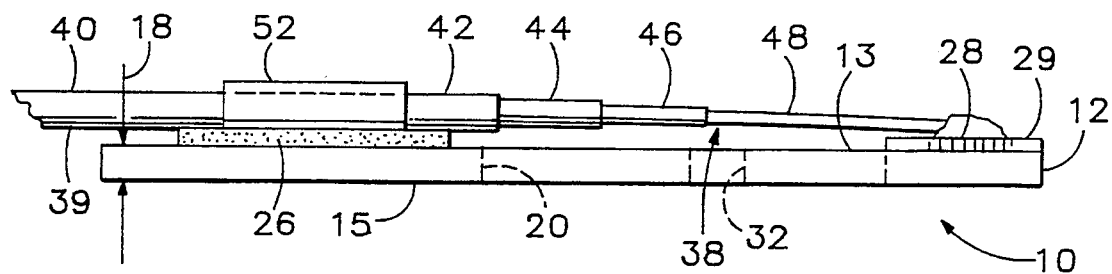
FIG. 2 is a side elevational view of the transfer frame an coaxial conductor pairs shown in FIG. 1, taken in the direction indicated by line 2—2.

Referring now to the drawings which form a part of the disclosure herein, a transfer frame 10 is shown in FIGS. 1 and 2. The transfer frame 10 includes a base plate 12 of an electrically non-conductive material preferably capable of withstanding temperatures at least as high as the melting temperature of solder compositions commonly used for electrical connections. For example, sheet material used as substrates for printed circuit boards is appropriate, and, in particular, a readily available and inexpensive material known as FR-4 is suitable for use as the base plate 12. The base plate 12 has a front side 13, a length 14, a rear side 15, a width 16 and a thickness 18. The base plate 12 defines an opening 20 which separates a first, or front support portion 22 from a second, or rear support portion 24. A layer of an adhesive material 26 is located on an area of the second support portion 24 extending alongside the opening 20. A suitable adhesive is an adhesive transfer tape such as that available from 3M Corporation as its high performance adhesive transfer tape No. Y-9485PC. Such a tape includes a layer of adhesive material and a cover sheet easily removable from the adhesive material once it has been placed on the base plate 12.

Located on the front support portion 22 are a number of attachment positions 28 spaced apart from one another along the length 14 of the base plate 12. Each of the attachment positions 28 is defined by and includes a test contact pad 29 which is an electrically isolated strip of conductive material precisely located on the base plate 12, as by conventional printed circuit manufacturing techniques.

Oppositely located end portions 30 of the base plate interconnect the front support portion 22 with the rear support portion 24 and define respective registration holes 32. The location of each of the attachment positions 28 is established precisely with respect to the registration holes 32, as will be understood presently. Preferably, the thickness 18 of the base plate 12 is kept as small as practical consistent with rigidity, in order not to impede access through the opening 20 for connecting the individual conductors, although the thickness 18 must be great enough, for example 0.015–0.032 inch, to ensure that the registration holes 32 or other registration appliance is strong enough to hold the transfer frame 10 in a required position. Each of the attachment positions 28 may have a width 34 of 0.015 inch, and the attachment positions may be located on a pitch 36 of 0.025 inch, for insulated conductors with central conductors of 40 AWG wire and an outside diameter of 0.023 inch, for example.

End portions 38 of a small number of coaxial conductor pairs 40 are shown attached to the transfer frame 10 in FIGS. 1 and 2, with each of the coaxial pairs 40 including an outer jacket 42 of insulating material, an outer conductor or shield 44, a layer of dielectric material 46 within the shield 44, and a core or central conductor 48. In some coaxial conductor arrangements (not shown) there may be additional layers of shield conductors and dielectric materials to be dealt with in a fashion similar to that disclosed herein, as will be understood.

Each of the central conductors 48 is attached mechanically, and preferably electrically, in a respective one of the attachment positions 28, and the outer jacket 42 of each coaxial conductor pair 40 is located on and held by the layer of adhesive material 26, so that the end portion 38 of each of the coaxial conductor pairs 40 extends across the opening 20, with the several coaxial conductor pairs 40 arranged parallel with each other. It will be understood that the pitch 36 is determined by the geometrical requirements made by the electrical circuit to which the several coaxial conductor pairs 40 are to be connected. In most applications there will be a number of coaxial conductor pairs 40 equal to the number of attachment positions 28, and that the transfer frame 10 will be of a size corresponding to the location, such as a part of a printed circuit board, in an electrical circuit where the conductors such as the coaxial conductor pairs 40 are to be connected electrically.

Once all of the coaxial conductor pairs 40 have been attached to the transfer frame 10 as described above, electrical tests may be carried out in the individual coaxial conductor pairs separately, and any coaxial conductor pairs found to be defective or connected in the incorrect position may be individually released and replaced as necessary, as by using spare conductors provided within the multi-conductor cable.

The use of the transfer frame 10 and the method according to the present invention are probably most advantageous in the case of a cable in which the specific function of each of the individual coaxial conductor pairs 40 has been determined, as by connection of one end of the cable to a terminal device such as a connector, or to another portion of an electrical circuit. In that case, each individual coaxial conductor pair 40 is fastened to the transfer frame 10 in a position determined by its function and the position in which it is intended to attach the respective coaxial conductor pair 40 to a portion of an electrical circuit.

Using the transfer frame 10 as described above, the single identification of each transfer frame 10 accomplishes identification of the entire group of conductors attached to the transfer frame 10, thus greatly reducing the number of separate identifications needed to accomplish termination of a multi-conductor cable, which may include as many as several hundred individual conductor pairs to be connected in the proper locations in an electrical circuit to which the cable is related.

In the transfer frame 10 shown in FIGS. 1 and 2, the opening 20 has a width 50 which is great enough to provide access to the shield conductor 44 so that it can be connected electrically to a respective terminal electrode forming a part of an electrical circuit, and also to provide sufficient room for connection of each of the central conductors 48 to a respective terminal defined on the electronic circuit. Thus, for example, when the width 50 of the opening 20 is about 0.220 inch, each of a plurality of coaxial conductor pairs 40 is prepared by selectively stripping the several layers of material including the jacket 42, shield 44 and dielectric 46 to expose and tin about 0.060–0.075 inch of the shield 44, along the length of the coaxial conductor pair, to expose about 0.050 inch of the dielectric material 46, and to expose an additional length of the central conductors 48 sufficient to extend across the remaining portion of the width 50 and onto the respective attachment position 28 far enough to be attached effectively.

Preferably, each of the central conductors 48 is attached mechanically to a respective attachment position 28 by soldering, or, alternatively, by a conductive adhesive such as a conductive polymeric resin adhesive, so that each of the test contact pads 29 associated with the attachment points 28 is available to be utilized as a contact for applying test signals to test the electrical characteristics of the coaxial conductor pairs 40. Similarly, the shields 44 are left exposed, providing for electrical contact by test probes in such testing of the coaxial conductor pairs 40 after attachment to the transfer frame 10.

Depending upon the size of the conductors such as coaxial conductor pairs 40 to be attached to the transfer frame 10 according to the present invention, and depending also upon the pitch 36 between conductors, different conventional techniques may be used to attach each of the central conductors 48 in a respective attachment position 28. In the case of extremely small coaxial conductor pairs, to be connected to an electrical circuit in a minimum amount of space, it is preferred to identify each of the coaxial conductor pairs 40, to selectively strip the ends to expose the central conductor 48, dielectric material 46, and shield 44 of each coaxial conductor pair in a conventional manner, such as that described in U.S. Pat. No. 4,993,968, and then to align them side by side, that is, parallel with each other. Once the ends of all the coaxial conductor pairs 40 have been thus prepared, they can be placed on the transfer frame 10 to be retained by the grip of the adhesive 26 on the outer jacket 42, and each of the central conductors 48 can then be soldered individually to the respective attachment position 28. Once the central conductors 48 have been attached to the respective attachment positions 28, any needed adjustment in the positions of the outer jackets 42 on the adhesive 26 may be made, in order to have the conductors extend parallel with one another across the width 50 of the opening 20. Once all of the coaxial conductor pairs 40 have been attached and their locations atop the layer 26 of adhesive are satisfactory, a piece of an adhesive tape 52, preferably of a material which is compatible with electronic circuit boards, such as a flexible polyimide tape having a layer of an adhesive material, is preferably placed atop the conductors to hold them more securely in place on the transfer frame 10 prior to shipment and installation and electrical connection to a circuit. An acceptable adhesive tape is available from 3M Company, of St. Paul, Minn., as No. 5413 industrial adhesive tape.

Figure 3:
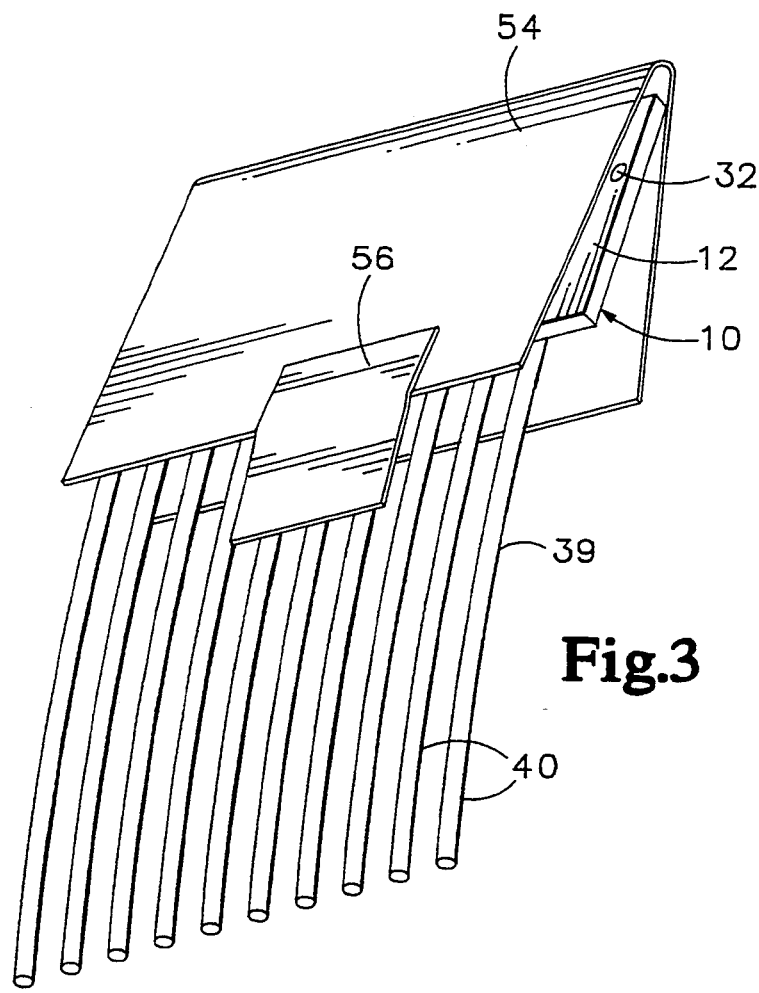
FIG. 3 is a pictorial representation of a group of coaxial conductor pairs attached to the transfer frame shown in FIGS. 1 and 2 and covered to protect against damage during shipment.

Once a set of conductors such as the coaxial conductors 40 has been attached to the transfer frame 10 as described above the assembled transfer frame 10 and conductors may be protected against possible damage during handling, such as shipment of the cable to a separate location where the cable will be attached to an electronic circuit (not shown), by covering the transfer frame and the attached conductors by a folded piece of paper 54 held in place by ordinary adhesive tape 56 as shown in FIG. 3.

Figure 4:
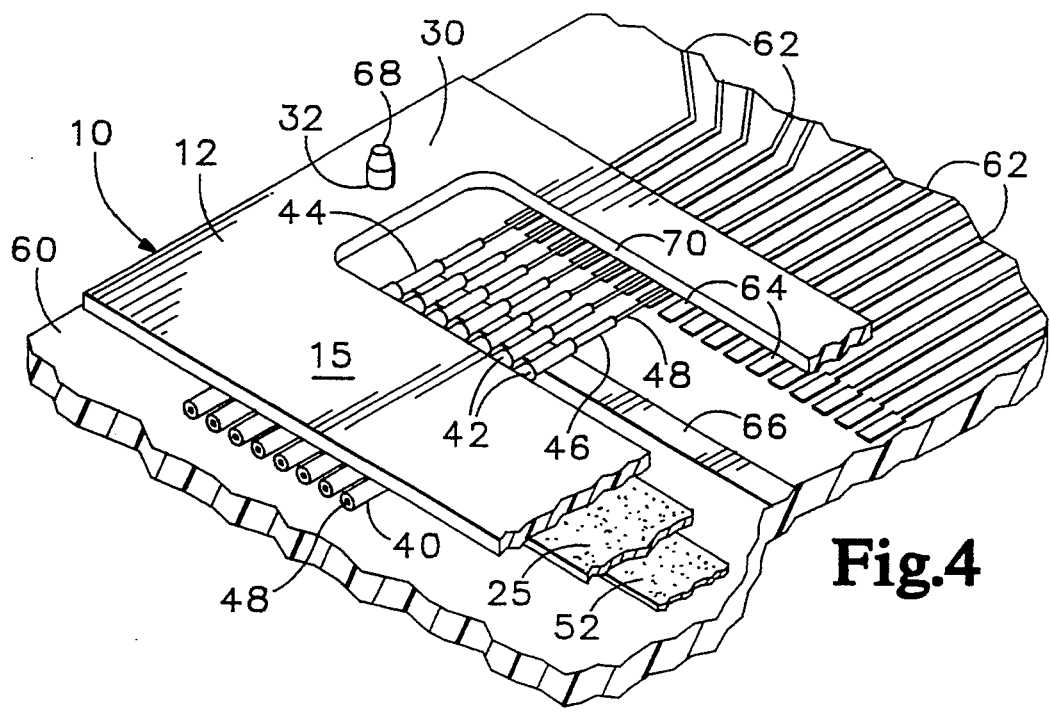
FIG. 4 is a cut-away perspective view, at an enlarged scale, of a portion of a transfer frame such as that shown in FIG. 1 in place upon a portion of a printed circuit board, illustrating the manner of use of the transfer frame for facilitating connection of a group of coaxial pairs to an electrical circuit.

Referring next to FIG. 4 a portion of a printed circuit board 60 includes numerous printed conductor traces 62. Each conductor trace has a corresponding terminal pad 64 all of which are aligned with regular spacing in a straight row across a portion of the printed circuit board 60. One or more ground plane terminals such as the ground plane terminal pad 66, of conductive material, are also provided a small distance away from the terminal pads 64.

The transfer frame 10, carrying the coaxial conductor pairs 40 attached as explained previously in connection with FIGS. 1 and 2, is located atop the printed circuit board 60, with the coaxial conductor pairs 40 in contact with the printed circuit board. Preferably, prior to placement of the transfer frame 10 and the conductors carried thereon atop the printed circuit board 60, the terminal pads 64 and the ground plane terminal 66 are tinned.

A registration pin 68 which is located precisely on the printed circuit board 60, preferably so that it is removable, extends upward through each registration hole 32. Because the transfer frame 10 is manufactured to correspond with the printed circuit board 60, the exposed portion of each of the central conductors 48 is located atop and in physical contact with or spaced only slightly above a respective one of the terminal pads 64, and each of the tinned outer shield portions 44 is located atop the ground plane terminal 66.

Once the transfer frame 10 is in position atop the printed circuit board 60 as shown in FIG. 4, each of the central conductors 48 is soldered to the respective terminal pad 64 and each of the tinned outer shield portions 44 exposed within the opening 20 is soldered to the ground plane terminal 66, or to a corresponding individual shield termination pad (not shown), if each shield 44 is to be terminated separately. Preferably, depending partly on size and spacing, the several shield conductors 44 of the coaxial conductor pairs 40 are soldered to the printed circuit board in a single operation of reflowing the solder of the tinned shield portions 44 and the tinned ground plane terminal 66, as by the use of a thermode to provide the appropriate temperature for the appropriate length of time. Similarly, depending upon the size and the spacing of the central conductors 48 and the corresponding terminal pads 64, it may also be possible to concurrently solder each of the central conductors 48 to the corresponding terminal pads 64 in a similar fashion. If the central conductors 48 are extremely small and closely spaced, however, it may be necessary to solder each of those connections individually.

Once each central conductor 48 has been connected to a corresponding terminal pad 64, the particular central conductor 48 may be severed to free it from the front support portion 22 of the transfer frame 10. This may be done in the case of very small and closely spaced central conductors 48 by carefully running a sharp edged instrument along an inner surface 70 of the opening 20 after all of the central conductors 48 have been connected to the respective terminal pads 64, taking care not to damage the circuit conductor traces 62 during the process. This leaves the clipped-off ends 72 of the central conductors 48 barely exposed above the terminal pads 64.

Once all of the conductors have been electrically connected to the printed circuit board 60, and after the central conductors 48 have been severed within the opening 20, the transfer frame 10 may be removed from the printed circuit board 60 by releasing the adhesive 26 from the body 39 of each conductor by the use of an appropriate solvent. For example, with the adhesive 26 described previously, a small amount of an alcohol such as isopropyl alcohol may be applied along the outer jackets 42 of the coaxial conductor pairs, to travel by capillary action along the conductors to the surface of the layer of adhesive material 26 to release the outer jackets 42 from the adhesive material. This allows the transfer frame 10, including the layer of adhesive material, to be removed from the printed circuit board, leaving the conductor pairs 40 connected in the desired locations on the printed circuit board 60.

If a strip of tape 52 has been utilized to stabilize the conductor pairs on the transfer frame, it will remain attached to the conductor pairs unless its adhesive material is released by a suitable releasing agent. It is therefore preferable for the material of such a tape 52 to be a polyimide or other material compatible with being left on the portion of an electrical circuit where the conductors are connected.

Figure 5:
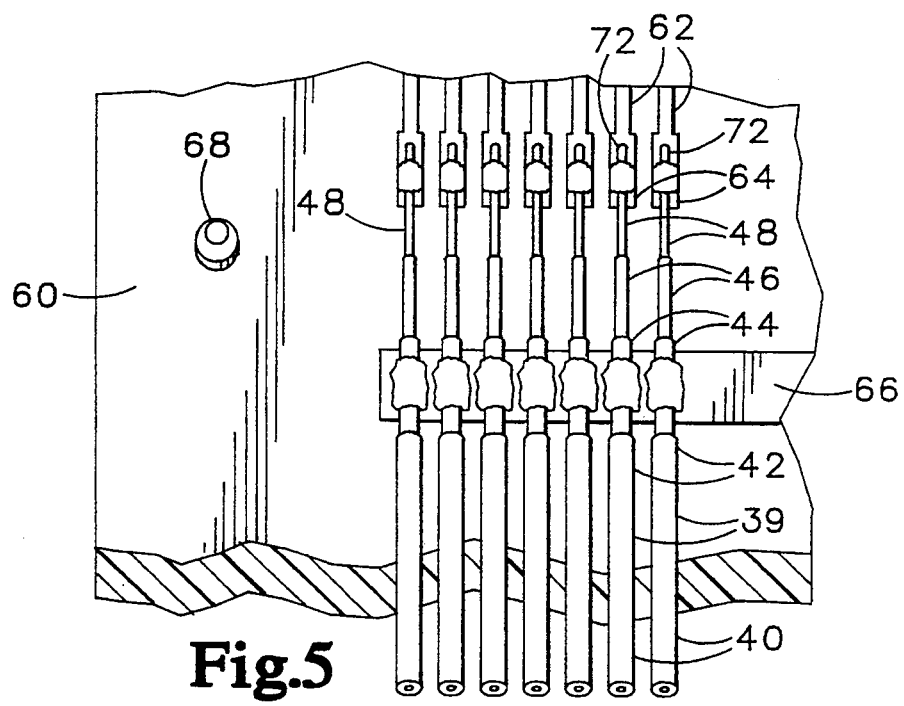
FIG. 5 is a view of a plurality of coaxial conductor pairs connected to the portion of a printed circuit board shown in FIG. 4, at a further enlarged scale.

Once the transfer frame 10 has been removed from the printed circuit board the coaxial conductor pairs 40 will remain as in FIG. 5, showing only a few of the several coaxial conductor pairs 40. Use of the transfer frame 10, as explained above, is capable of saving significant amounts of time which would otherwise be needed to identify, individually place, and individually solder or otherwise connect electrically the several conductors of a multi-conductor electrical cable.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of preparing a plurality of electrical conductors of an electrical cable including multiple separately insulated mechanically separate electrical conductors for connection of said electrical conductors to a part of an electrical circuit, the method comprising:
    (a) selecting a plurality of mechanically separate, separately insulated, electrical conductors from multi-conductor electrical cable;
    (b) stripping an end portion of each of said plurality of electrical conductors;
    (c) providing a transfer frame having abase, an array of electrically separate attachment positions located proximate one another atop said base, and a rear support portion separated from said attachment positions by an opening defined through said base;
    (d) arranging said plurality of electrical conductors of said multi-conductor cable side-by-side, in a predetermined order;
    (e) mechanically attaching said end portion of each of said plurality of electrical conductors to a respective one of said attachment positions located on said transfer frame, with a predetermined spacing between said electrical conductors, while maintaining said predetermined order;
    (f) mechanically attaching a respective body portion of each of said plurality of electrical conductors to said rear support portion of said transfer frame in said predetermined order and at said predetermined spacing, thus supporting said plurality of electrical conductors with a part of each said end portion spanning said opening defined through said base of said transfer frame; and
    (g) thereafter retaining said plurality of electrical conductors thusly attached to said transfer frame during subsequent handling of said multi-conductor cable prior to connection of all of said plurality of electrical conductors to a part of an electrical circuit.

2. The method of claim 1, including the steps of selecting an additional plurality of electrical conductors from said multi-conductor cable, providing an additional transfer frame, arranging said additional plurality of electrical conductors, and attaching them to said additional transfer frame by performing, with respect to said additional plurality of electrical conductors and said additional transfer frame, steps (b) and (d)–(g) of claim 1.

3. The method of claim 1 wherein each of said plurality of electrical conductors is a central conductor of a respective coaxial pairs, including the step of removing exterior insulation from a portion of an outer shield conductor of each said coaxial pair at a location adjacent said end portion.

4. The method of claim 1, including the further steps of removing a defective one of said plurality of electrical conductors from said transfer frame while continuing to retain remaining ones of said plurality of electrical conductors attached to said transfer frame and thereafter selecting a replacement conductor from said multi-conductor electrical cable and attaching said replacement conductor to said transfer frame by selectively stripping an end portion of said replacement conductor, thereafter mechanically attaching said end portion of said replacement conductor to a responsive one of said attachment positions located on said transfer frame, and mechanically attaching a body portion of said replacement conductor to said rear support portion of said transfer frame, thus supporting said replacement conductor at said predetermined spacing from an adjacent one of said electrical conductors with a part of said end portion of said replacement conductor spanning said opening defined through said base of said transfer frame.

5. The method of claim 1 wherein said step of mechanically attaching a respective body portion of each of said insulated electrical conductors to said rear support portion of said transfer frame includes adhesively attaching an insulating outer jacket of a coaxial conductor pair to said rear support portion of said transfer frame.

6. A method of preparing a plurality of electrical conductors of a multi-conductor electrical cable for connection of said electrical conductors to a part of an electrical circuit, comprising:
    (a) arranging a selected plurality of insulated electrical conductors of a multi-conductor cable side-by-side, in a predetermined order and with a predetermined spacing therebetween;
    (b) selecting stripping an end portion of each of said electrical conductors;
    (c) mechanically attaching each said end portion to a respective electrically separate attachment position located on a transfer frame, by using solder for connecting each said end portion to a respective test contact pad located on said transfer frame;
    (d) mechanically attaching a respective body portion of each of said electrical conductors to a rear support portion of said transfer frame;
    (e) by said transfer frame supporting said electrical conductors in said predetermined order and with said predetermined spacing therebetween, with a part of each said end portion spanning an opening defined through said transfer frame; and
    (f) thereafter retaining said plurality of electrical conductors thusly attached to said transfer frame during subsequent handling of said multi-conductor cable prior to connection of all of said plurality of electrical conductors to a part of an electrical circuit.

7. A method of preparing a plurality of electrical conductors of a multi-conductor electrical cable for connection of said electrical conductors to a part of an electrical circuit, comprising:
    (a) arranging a selected plurality of insulated electrical conductors of a multi-conductor cable side-by-side, in a predetermined order and with a predetermined spacing therebetween;
    (b) selectively stripping an end portion of each of said electrical conductors;
    (c) mechanically attaching each said end portion to a respective electrically separate attachment position located on a transfer frame, by using a conductive polymeric resin adhesive for connecting each said end portion to a respective test contact pad located on said transfer frame;
    (d) mechanically attaching a respective body portion of each of said electrical conductors to a rear support portion of said transfer frame;
    (e) by said transfer frame supporting said electrical conductors in said predetermined order and with said predetermined spacing therebetween, with a part of each said end portion spanning an opening defined through said transfer frame; and (f) thereafter retaining said plurality of electrical conductors thusly attached to said transfer frame during subsequent handling of said multi-conductor cable prior to connection of all of said plurality of electrical conductors to a part of an electrical circuit.

8. A method of preparing a plurality of electrical conductors of a multi-conductor electrical cable for connection of said electrical conductors to a part of an electrical circuit, comprising:

(a) arranging a selected plurality of insulated electrical conductors of a multi-conductor cable side-by-side, in a predetermined order and with a predetermined spacing therebetween;

(b) selectively stripping an end portion of each of said electrical conductors;

(c) mechanically attaching each said end portion of a respective electrically separate attachment position located on a transfer frame;

(d) mechanically attaching a respective body portion of each said electrical conductor to a rear support portion of said transfer frame;

(e) by said transfer frame supporting said electrical conductors in said predetermined order and with said predetermined spacing therebetween, with a part of each said end portion spanning an opening defined through said transfer frame;

(f) testing one of said electrical conductors by electrically contacting a test contact pad associated positions located on said transfer frame while retaining said plurality of electrical conductors attached to said transfer frame; and (g) thereafter retaining said plurality of electrical conductors thusly attached to said transfer frame during subsequent handling of said multi-conductor cable prior to connection of all of said plurality of electrical conductors to a part of an electrical circuit.

9. A method of connecting a plurality of conductors of a multi-conductor electrical cable, comprising:

(a) arranging selected insulated conductors of a multi-conductor cable side-by-side in a predetermined order and with a predetermined spacing therebetween;

(b) removing insulation from an end portion of each of said conductors;

(c) adhesively attaching each said end portion to a respective electrical test contact pad located on a transfer frame;

(d) adhesively attaching a body portion of each said insulated conductor to a rear support portion of said transfer frame;

(e) supporting said insulated conductors with a part of each said end portion spanning an opening defined by said transfer frame;

(f) thereafter retaining said plurality of conductors attached to said transfer frame during subsequent handling of said multi-conductor cable prior to connection of all of said plurality of insulated conductors to a part of an electrical circuit;

(g) placing said transfer frame in a predetermined location with respect to a set of terminal pads, and thereby placing each of said conductors in a predetermined location relative to a respective one of said terminal pads; and (h) connecting each of said conductors electrically to a respective one of said terminal pads while said transfer frame holds each of said conductors in said respective predetermined location.

10. The method of claim 9 wherein each of said conductors is a central conductor of a coaxial conductor pair, including the step of electrically connecting an outer conductor of said coaxial conductor pair to a respective electrical terminal located adjacent a respective one of said terminal pads.

11. A method of connecting a plurality of conductors of an electrical cable including multiple separately insulated mechanically separate electrical conductors to a part of an electrical circuit, the method comprising:

(a) selecting a plurality of mechanically separate, separately insulated, electrical conductors from a multi-conductor electrical cable;

(b) stripping an end portion of each of said plurality of electrical conductors;

(c) providing a transfer frame having a base, an array of electrically separate attachment positions located proximate one another atop said base, and a rear support portion separated from said attachment positions by an opening defined through said base;

(d) arranging said plurality of electrical conductors of said multi-conductor cable side-by-side, in a predetermined order;

(e) mechanically attaching said end portion of each of said plurality of electrical conductors to a respective one of said attachment positions located on said transfer frame, with a predetermined spacing between said electrical conductors, while maintaining said predetermined order;

(f) mechanically attaching a respective body portion of each of said plurality of electrical conductors to said rear support portion of said transfer frame in said predetermined order and at said predetermined spacing, thus supporting said plurality of electrical conductors with a part of each said end portion spanning said opening defined through said base of said transfer frame;

(g) thereafter retaining said plurality of electrical conductors thusly attached to said transfer frame during subsequent handling of said multi-conductor cable prior to connection of all of said plurality of electrical conductors to a part of an electrical circuit;

(h) placing said transfer frame in a predetermined location with respective to a set of terminal pads included in said electrical circuit, thereby placing each of said electrical conductors in a predetermined location relative to a respective one of said terminal pads; and (i) connecting each of said electrical conductors electrically to a respective one of said terminal pads while said transfer frame holds each of said electrical conductors in said respective predetermined location.

* * * * *